(12) United States Patent
Wong et al.

(10) Patent No.: US 9,748,372 B2
(45) Date of Patent: Aug. 29, 2017

(54) SEMICONDUCTOR STRUCTURE AND METHOD OF FORMING THE SAME

(71) Applicant: TAIWAN SEMICONDUCTOR MANUFACTURING COMPANY, LTD., Hsinchu (TW)

(72) Inventors: King-Yuen Wong, Tuen Mun (HK); Chen-Ju Yu, Jiaoxi Township (TW); Fu-Wei Yao, Hsinchu (TW); Chun-Wei Hsu, Taichung (TW); Jiun-Lei Jerry Yu, Zhudong Township (TW); Chih-Wen Hsiung, Hsinchu (TW); Fu-Chih Yang, Fengshan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/926,783

(22) Filed: Oct. 29, 2015

(65) Prior Publication Data

US 2016/0049505 A1    Feb. 18, 2016

Related U.S. Application Data

(63) Continuation of application No. 14/476,255, filed on Sep. 3, 2014, now Pat. No. 9,184,259, which is a
(Continued)

(51) Int. Cl.
*H01L 29/778* (2006.01)
*H01L 29/51* (2006.01)
(Continued)

(52) U.S. Cl.
CPC .... *H01L 29/7786* (2013.01); *H01L 21/28264* (2013.01); *H01L 29/513* (2013.01);
(Continued)

(58) Field of Classification Search
CPC ...................... H01L 29/66462; H01L 29/7786
See application file for complete search history.

(56) References Cited

U.S. PATENT DOCUMENTS 9,184,259 B2 * 11/2015 Wong .................... H01L 29/517
2009/0072240 A1    3/2009 Suh et al.
(Continued)

OTHER PUBLICATIONS

Chen, Hongwei, et al., "Enhancement-Mode AlGaN/GaN HEMTs Fabricated by Standard Fluorine Ion Implantation", CS Mantech Conference, May 17-20, 2010, Portland, Oregon, USA, pp. 145-148.
(Continued)

*Primary Examiner* — Peniel M Gumedzoe
*Assistant Examiner* — Christopher Johnson
(74) *Attorney, Agent, or Firm* — Hauptman Ham, LLP

(57) ABSTRACT

A method of forming a semiconductor structure includes growing a second III-V compound layer over a first III-V compound layer, wherein the second III-V compound layer has a different band gap from the first III-V compound layer. The method further includes forming a source feature and a drain feature over the second III-V compound layer. The method further includes forming a gate dielectric layer over the second III-V compound layer, the source feature and the drain feature. The method further includes implanting at least one fluorine-containing compound into a portion of the gate dielectric layer. The method further includes forming a gate electrode over the portion of the gate dielectric layer.

20 Claims, 5 Drawing Sheets

Related U.S. Application Data continuation of application No. 13/297,525, filed on Nov. 16, 2011, now Pat. No. 8,841,703.

(60) Provisional application No. 61/553,510, filed on Oct. 31, 2011.

(51) Int. Cl.
*H01L 29/66* (2006.01)
*H01L 21/28* (2006.01)
*H01L 29/20* (2006.01)
*H01L 29/207* (2006.01)

(52) U.S. Cl.
CPC ...... *H01L 29/517* (2013.01); *H01L 29/66462* (2013.01); *H01L 29/7787* (2013.01); *H01L 29/2003* (2013.01); *H01L 29/207* (2013.01)

(56) References Cited

U.S. PATENT DOCUMENTS

| | | | |
|---|---|---|---|
| 2010/0062614 A1* | 3/2010 | Ma | C23C 16/34 438/785 |
| 2010/0140664 A1* | 6/2010 | Sheppard | H01L 29/7787 257/194 |
| 2010/0261298 A1* | 10/2010 | Kirkpatrick | H01L 21/02532 438/16 |
| 2011/0275166 A1* | 11/2011 | Shero | C23C 16/30 438/5 |
| 2012/0139038 A1* | 6/2012 | Imanishi | H01L 29/0692 257/330 |
| 2012/0149161 A1 | 6/2012 | Ohki et al. | |

OTHER PUBLICATIONS

Imada, T., et al., "Enhancement-Mode GaN MIS-HEMTs for Power Supplies", The 2010 International Power Electronics Conference, pp. 1027-1033.

Inoue, M., et al., "Fluorine Incorporation into HfSiON Dielectric for Vth Control and its Impact on Reliability for Poly-Si Gate pFET", IEEE 2005, 4 pages.

Cai, Yong, et al., "High-Performance Enhancement-Mode AlGaN/GaN HEMTS Using Fluoride-Based Plasma Treatment", IEEE Electron Device Letters, vol. 26, No. 7, Jul. 2005, pp. 435-437.

Song et al., "Normally Off AlGaN/GaN Low-Density Drain HEMT (LDD-HEMT) With Enhanced Breakdown Voltage and Reduced Current Collapse", IEEE Electron Device Letters, vol. 28, No. 3, pp. 189, Mar. 2007, doi: 10.1109/ LED.2007.891281.

Chen et al., "Fabrication of Enhancement-Mode AlGaN/GaN MISHEMTs by Using Fluorinated Al2O3 as Gate Dielectrics", IEEE Electron Device Letters, vol. 32, No. 10, Oct. 2011, pp. 1373.

Lee et al., "AlGaN/GaN High-Electron-Mobility Transistors Fabricated Through a Au-Free Technology", IEEE Electron Device Letters, vol. 32, No. 5, May 2011, pp. 623.

* cited by examiner

SEMICONDUCTOR STRUCTURE AND METHOD OF FORMING THE SAME

PRIORITY CLAIM

The present application is a continuation of U.S. application Ser. No. 14/476,255, filed Sep. 3, 2014, which is a continuation of U.S. application Ser. No. 13/297,525, filed Nov. 16, 2011, now U.S. Pat. No. 8,841,703, issued Sep. 23, 2014, which claims priority of U.S. Provisional Application No. 61/553,510, filed Oct. 31, 2011, all of which are incorporated herein by reference in their entireties.

TECHNICAL FIELD

This disclosure relates generally to a semiconductor structure and a method of forming a semiconductor structure.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is marked on the substrate by scribe lines between the chip regions. The substrate will go through a variety of cleaning, layering, patterning, etching and doping steps to form integrated circuits. The term "substrate" herein generally refers to the bulk substrate on which various layers and device structures are formed. In some embodiments, the bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
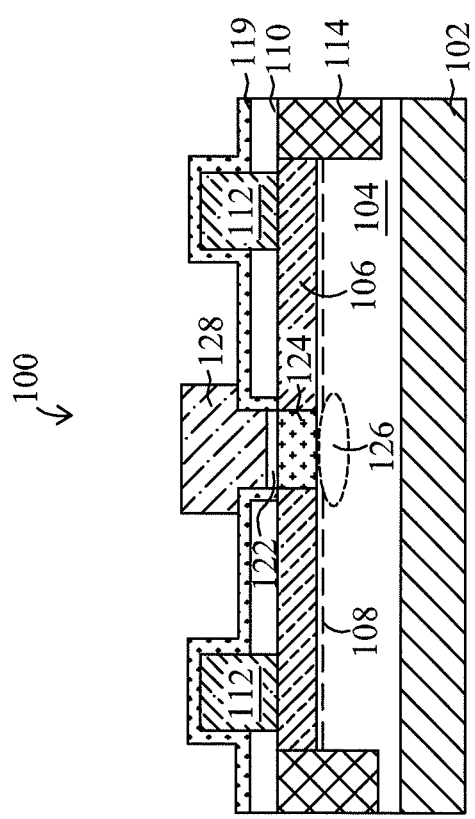
FIG. 1 is a cross-sectional view of a semiconductor structure having a high electron mobility transistor (HEMT) according to one or more embodiments of this disclosure.

FIG. 1 is a cross-sectional view of a semiconductor structure 100 having a high electron mobility transistor (HEMT) according to one or more embodiments of this disclosure.

Referring to FIG. 1, the semiconductor structure 100 having a HEMT is illustrated. The semiconductor structure 100 includes a substrate 102. In some embodiments, the substrate 102 includes a silicon carbide (SiC) substrate, sapphire substrate or a silicon substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In at least one embodiment, the semiconductor structure 100 includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum gallium nitride (AlGaN) layer (also referred to as AlGaN layer 106). The GaN layer 104 and AlGaN layer 106 directly contact each other. In another example, the channel layer 104 includes a GaAs layer or InP layer. The donor-supply layer 106 includes an AlGaAs layer or an AlInP layer.

The GaN layer 104 is undoped. Alternatively, the GaN layer 104 is unintentionally doped, such as lightly doped with n-type dopants due to a precursor used to form the GaN layer 104. In one example, the GaN layer 104 has a thickness in a range from about 0.5 microns to about 10 microns.

The AlGaN layer 106 is intentionally doped. In one example, the AlGaN layer 106 has a thickness in a range from about 5 nanometers (nm) to about 50 nm.

The band gap discontinuity exists between the AlGaN layer 106 and the GaN layer 104. The electrons from a piezoelectric effect in the AlGaN layer 106 drop into the GaN layer 104, creating a very thin layer 108 of highly mobile conducting electrons in the GaN layer 104. This thin layer 108 is referred to as a two-dimensional electron gas (2-DEG), forming a carrier channel (also referred to as the carrier channel 108). The thin layer 108 of 2-DEG is located at an interface of the AlGaN layer 106 and the GaN layer 104. Thus, the carrier channel has high electron mobility because the GaN layer 104 is undoped or unintentionally doped, and the electrons can move freely without collision or with substantially reduced collisions with impurities.

The semiconductor structure 100 also includes a source feature and a drain feature disposed on the AlGaN layer 106 and configured to electrically connect to the carrier channel 108. Each of the source feature and the drain feature comprises a metal feature 112. In one example, the metal feature 112 is free of Au and comprises Al, Ti, or Cu.

The semiconductor structure 100 further includes a dielectric cap layer 110 disposed on a top surface of the AlGaN layer 106 not occupied by the metal features 112. The dielectric cap layer 110 further includes an opening that exposes a portion of the AlGaN layer 106 for a gate electrode formation. The dielectric cap layer 110 protects the underlying AlGaN layer 106 from damage in the following process having plasma.

The semiconductor structure 100 further includes isolation regions 114 in the first III-V compound layer 104 and the second III-V compound layer 106. The isolation regions 114 isolate the HEMT in the structure 100 from other devices in the substrate 102. In one example, the isolation region 114 includes a doped region with species of oxygen or nitrogen.

The semiconductor structure 100 further includes a gate dielectric layer 119 deposited on the dielectric cap layer 110 and top surfaces of the source feature and the drain feature. The gate dielectric layer 119 is also disposed along an interior surface of the opening and on the exposed portion of the AlGaN layer 106. In one example, the gate dielectric layer 119 has a thickness in a range from about 3 nm to about 20 nm. In some examples, the gate dielectric layer 119 comprises silicon oxide, silicon nitride, gallium oxide, aluminum oxide, scandium oxide, zirconium oxide, lanthanum oxide or hafnium oxide. Furthermore, the gate dielectric layer 119 includes a fluorine segment 122 within the opening of the dielectric cap layer 110 on the exposed portion of the AlGaN layer 106.

In some embodiments, the semiconductor structure 100 further includes a protection layer (not shown). The protection layer is disposed on top surfaces of the metal features 112 and under the gate dielectric layer 119. The protection layer further includes an opening that aligns with the opening in the dielectric cap layer 110. The combined opening of the opening in the protection layer and the opening in the dielectric cap layer 110 exposes the portion of the AlGaN layer 106 for the gate electrode formation. The protection layer covers the source feature and the drain feature, and prevents the source feature and the drain feature from exposure during an annealing process in the formation of the isolation regions 116.

The semiconductor structure 100 also includes a gate electrode 128 disposed on the opening over AlGaN layer 106 between the source and drain features. The gate electrode 128 includes a conductive material layer configured for voltage bias and electrical coupling with the carrier channel 108. In various examples, the conductive material layer includes a refractory metal or its compounds, e.g., titanium (Ti), titanium nitride (TiN), titanium tungsten (TiW) and tungsten (W). In another example, the conductive material layer includes nickel (Ni), gold (Au) or copper (Cu). In one example, at least a portion of the gate electrode 128 is disposed on fluorine segment 122 of the gate dielectric layer 119 in the opening over the AlGaN layer 106.

The semiconductor structure 100 also includes a depletion region 126 in the carrier channel 108 under the opening in the dielectric cap layer 110. The carrier channel 108 becomes normally-off because of the depletion region 126. A positive gate voltage should be applied to turn on the carrier channel 108 of this HEMT. This HMET is also called an enhanced-mode HEMT that is opposite to a depletion-mode HEMT. The depletion-mode HEMT has a normally-on carrier channel and a negative gate voltage should be applied to turn off the carrier channel.

The semiconductor structure 100 further includes a fluorine region 124 embedded in AlGaN layer 106 under the opening (namely under the gate electrode 128). A majority of the fluorine region 124 overlaps the fluorine segment 122 in the gate dielectric layer 119. The fluorine atoms in the fluorine region 124 provide strong immobile negative charges and effectively deplete the electrons in depletion region 126.

In the above described embodiments, the gate electrode 128, the source/drain features, and the carrier channel 108 in the GaN layer 104 are configured as a transistor. When a voltage is applied to the gate stack, a device current of the transistor could be modulated.

Figure 2:
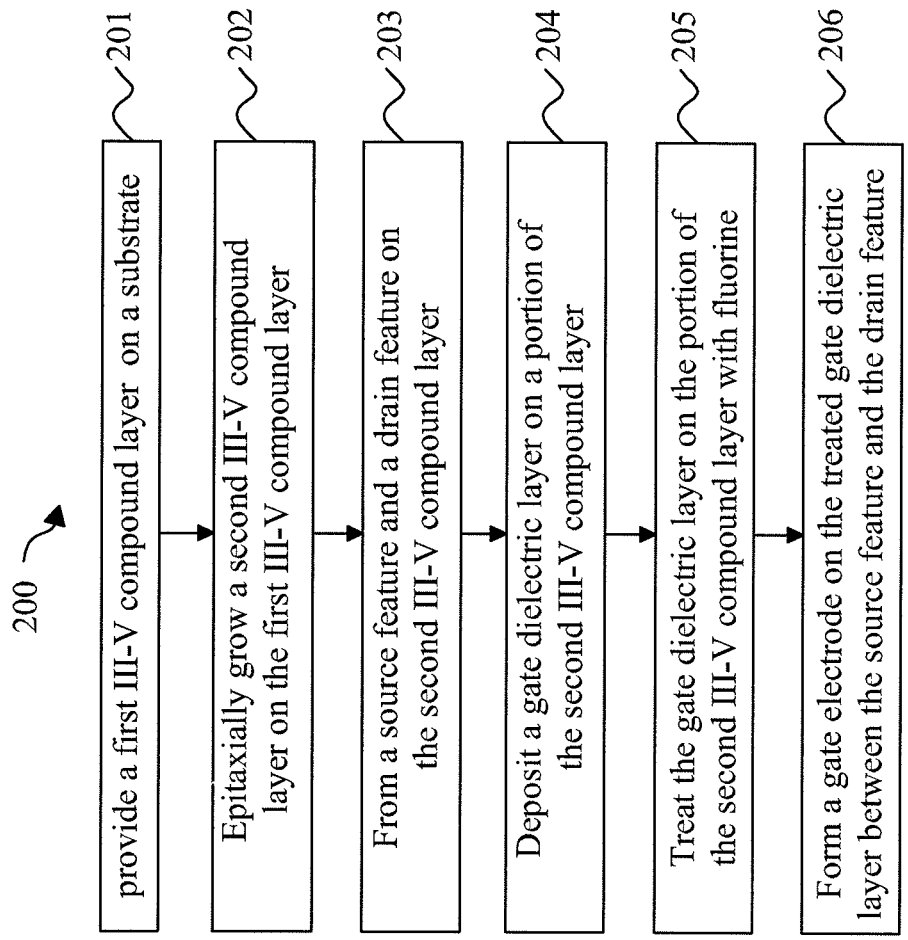
FIG. 2 is a flowchart of a method of forming a semiconductor structure having a HEMT according to one or more embodiments of this disclosure.

FIG. 2 is a flowchart of a method 200 of forming a semiconductor structure having a HEMT according to one or more embodiments of this disclosure. Referring now to FIG. 2, the flowchart of the method 200, at operation 201, a first III-V compound layer is provided. The first III-V compound layer is formed on a substrate. Next, the method 200 continues with operation 202 in which a second III-V compound layer is epitaxially grown on the first III-V compound layer. The method 200 continues with operation 203 in which a source feature and a drain feature are formed on the second III-V compound layer. The method 200 continues with operation 204 in which a gate dielectric layer is deposited on a portion of the second III-V compound layer. The method 200 continues with operation 205 in which the gate dielectric layer on the portion of the second III-V compound layer is treated with fluorine. The method 200 continues with operation 206 in which a gate electrode is formed on the treated gate dielectric layer between the source feature and the drain feature. It should be noted that additional processes may be provided before, during, or after the method 200 of FIG. 2.

FIGS. 3 to 8 are cross-sectional views of the semiconductor structure 100 having a HEMT at various stages of manufacture according to various embodiments of the method 200 of FIG. 2. Various figures have been simplified for a better understanding of the inventive concepts of the present disclosure.

Figure 3:
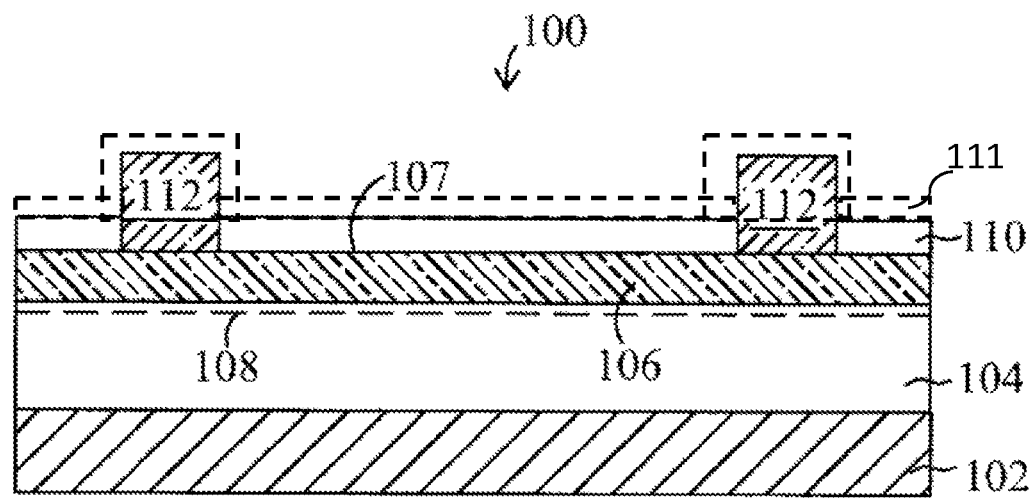
FIGS. 3 to 8 are cross-sectional views of a semiconductor structure having a HEMT at various stages of manufacture according to one embodiment of the method of FIG. 2.

Referring to FIG. 3, which is an enlarged cross-sectional view of a portion of a substrate 102 of a semiconductor structure 100 after performing operations 201, 202 and 203. In some embodiments, the substrate 102 includes a silicon carbide (SiC) substrate, sapphire substrate or a silicon substrate. A first III-V compound layer 104, also referred to as a channel layer, is grown on the substrate 102. In the embodiment of FIGS. 2-8, the first III-V compound layer 104 refers to a gallium nitride (GaN) layer (also referred to as the GaN layer 104). The GaN layer 104 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In the embodiment of FIGS. 2-8, the GaN layer 104 has a thickness in a range from about 0.5 micron to about 10 microns. In other embodiments, the first III-V compound layer 104 may include a GaAs layer or InP layer.

A second III-V compound layer 106, also referred to as donor-supply layer, is grown on first III-V compound layer 104. An interface is defined between the first III-V compound layer 104 and the second III-V compound layer 106. A carrier channel 108 of 2-DEG is located at the interface. In at least one embodiment, the second III-V compound layer 106 refers to an aluminum gallium nitride (AlGaN) layer (also referred to as the AlGaN layer 106). In the embodiment of FIGS. 2-8, the AlGaN layer 106 is epitaxially grown on the GaN layer 104 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. In the embodiment of FIGS. 2-8, the AlGaN layer 106 has a thickness in a range from about 5 nanometers to about 50 nanometers. In other embodiments, the second III-V compound layer 106 may include an AlGaAs layer, or AlInP layer.

A dielectric cap layer 110 is deposited on a top surface 107 of the second III-V compound layer 106. In the embodiment of FIGS. 2-8, the dielectric cap layer 110 has a thickness in a range from about 100 Å to about 5000 Å. In some embodiments, the dielectric cap layer 110 includes $SiO_2$ or $Si_3N_4$. In one example, the dielectric cap layer 110 is $Si_3N_4$ and is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Torr. The dielectric cap layer 110 protects the underlying second III-V compound layer 106 from damage in the following processes having plasma. Next, two openings in the dielectric cap layer 110 are defined by lithography and etching processes to expose a portion of the second III-V compound layer 106.

A metal layer is deposited over the dielectric cap layer 110, overfills the openings and contacts the second III-V compound layer 106. A photoresist layer (not shown) is formed over the metal layer and developed to form a feature over the openings. The metal layer not covered by the feature of the photoresist layer is removed by a reactive ion etch (RIE) process that etches the exposed portions of the metal layer down to the underlying the dielectric cap layer 110. Metal features 112 are generated after the etching process. The metal features 112 are configured as the source feature or the drain feature for the HEMT. The photoresist layer is removed after the formation of the metal features 112. The dielectric cap layer 110 protects the underlying second III-V compound layer 106 from damage during the etching process to form metal features 112. The carriers in carrier channel 108 of 2-DEG underlying the second III-V compound layer 106 would not be affected during the etching process. The electrical performances of the semiconductor structure 100 would be positively affected. Therefore, the yield of the overall assembly could increase.

In some embodiments, the metal layer of the metal features 112 includes one or more conductive materials. In at least one example, the metal layer is free of gold (Au) and comprises titanium (Ti), titanium nitride (TiN), or aluminum copper (AlCu) alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. Without using Au in the metal features 112, the method 200 could also be implemented in the production line of integrated circuits on silicon substrate. The contamination concern from Au on the silicon fabrication process could be eliminated.

Next, a protection layer 111 is optionally deposited on top surfaces of the metal features 112 and the dielectric cap layer 110. In some embodiments, the protection layer includes dielectric materials such as SiO2 or Si3N4. In one example, the protection layer is Si3N4 and is formed by performing a plasma enhanced chemical vapor deposition (PECVD) method. Protection layer 111 is not included in the other drawings for simplicity.

Figure 4:
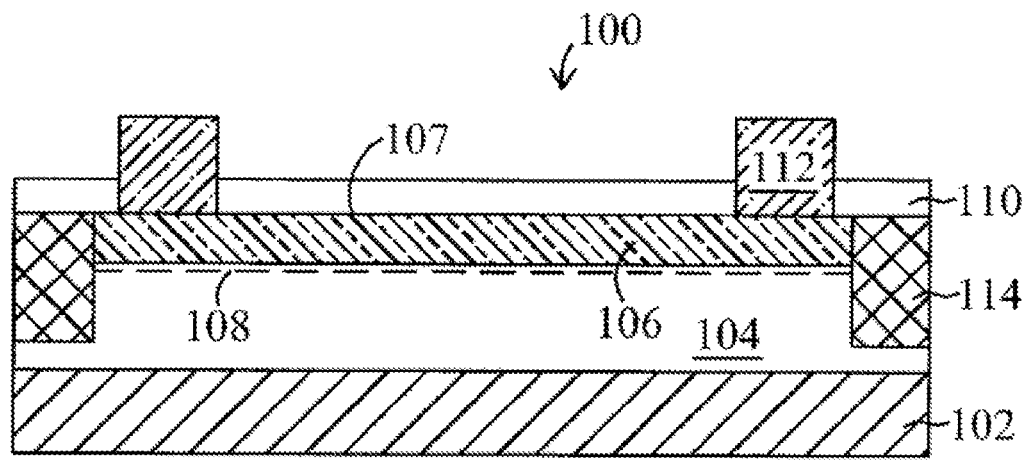

FIG. 4 illustrates the structure 100 after forming isolation regions 114 in the first III-V compound layer 104 and the second III-V compound layer 106. The isolation regions 114 isolate the HEMT in the structure 100 from other devices in the substrate 102. In one example, the isolation region 114 is formed by an implantation process with species of oxygen or nitrogen. The protection layer covers the source feature and the drain feature, and prevents the source feature and the drain feature from exposure during an annealing process after the implantation process for the isolation region 114 formation.

Figure 5:
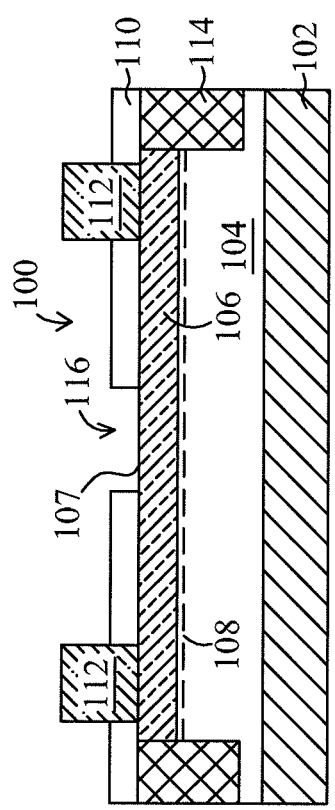

FIG. 5 illustrates the structure 100 after forming an opening 116 in the dielectric cap layer 110 (also in the protection layer if the protection layer exists). A patterned mask layer (not shown) is formed on a top surface of the dielectric cap layer 110 and an etching process is performed to remove a portion of the dielectric cap layer 110 (also remove a portion of the protection layer if the protection layer exists). The opening 116 exposes a portion of the top surface 107 of the second III-V compound layer 106. The opening 116 is configured as a location for the later gate electrode formation.

Figure 6:
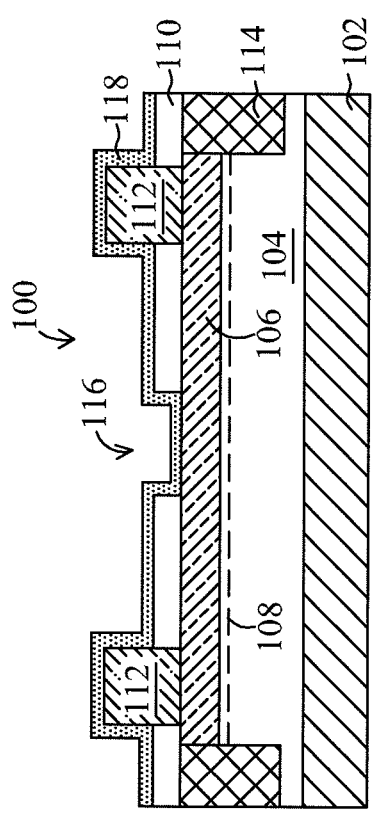

FIG. 6 illustrates the structure 100 after depositing a gate dielectric layer 118 in operation 204. The gate dielectric layer 118 is deposited on the dielectric cap layer 110, along an interior surface of the opening 116 and on the exposed portion of the second III-V compound layer 106. The gate dielectric layer 118 is also deposited over the source feature and the drain feature. In some embodiments, the gate dielectric layer 118 is in a thickness range from about 3 nm to about 20 nm. In some examples, the gate dielectric layer 118 comprises silicon oxide, silicon nitride, gallium oxide, aluminum oxide, scandium oxide, zirconium oxide, lanthanum oxide or hafnium oxide. In one embodiment, the gate dielectric layer 118 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the gate dielectric layer 118 is deposited. The ALD method provides a uniform thickness of the gate dielectric layer 118 with high quality. In one example, the gate dielectric layer 118 is zirconium oxide. In some embodiments, a first precursor includes tetrakis[ethylmethylamino]zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O$—

H₂O₂. In other embodiments, the gate dielectric layer 118 is formed by a plasma enhanced chemical vapor deposition (PECVD) or a low pressure chemical vapor deposition (LPCVD).

Figure 7:
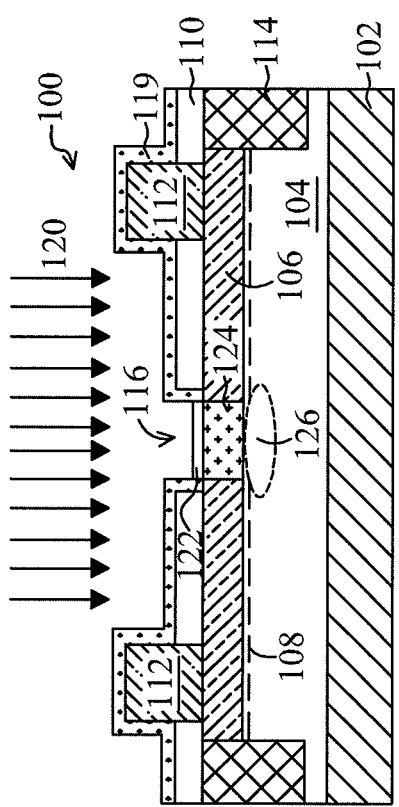

FIG. 7 illustrates the structure 100 after treating the gate dielectric layer 118 with fluorine (F) 120 in operation 205. The treated gate dielectric layer 119 includes a fluorine segment 122 in the opening 116 on the second III-V compound layer 106. The F atoms increase the dielectric constant of the treated gate dielectric layer 119 (namely the fluorine segment 122). During the operation of the HEMT, the electrons flow in the carrier channel 108 between the source feature and the drain feature. The electrons may inject into the gate dielectric layer 119. The F incorporation prevents the electrons trapped at the treated gate dielectric layer 119. Hence, the stability of the threshold voltage (Vt) of the HEMT in the structure 100 is improved. The treatment with fluorine (F) also forms a fluorine region 124 embedded in the second III-V compound layer 106. Since the patterned dielectric cap layer 110 screens F atoms from penetrating into the second III-V compound layer 106, the fluorine region 124 is defined underlying the opening 116. A majority of the fluorine region 124 overlaps and underlies the fluorine segment 122. The F atoms in the fluorine region 124 provide strong immobile negative charges and effectively deplete the electrons in the carrier channel 108. A depletion region 126 in the carrier channel 108 is generated under the fluorine region 124. The HEMT in the structure 100 is converted from a depletion-mode HEMT to an enhanced-mode HEMT. The carrier channel 108 becomes normally-off and a positive gate voltage should be applied to turn on the carrier channel 108 for this enhanced-mode HEMT.

In one example, the structure 100 is treated with fluorine by an implantation process. In some embodiments, a plurality of dopants in implantation process includes F or $BF_2$. An energy power of the implantation process is from about 5 Kev to about 20 Kev. A dosage of the dopants is in a range of about 1E12 ion/cm² to about 1E15 ion/cm². The fluorine segment 122 and the fluorine region 124 are formed simultaneously.

In another example, the structure 100 is also treated with fluorine by an implantation process including F or $BF_2$. The dosage of the dopants is in a range of about 1E12 ion/cm² to about 1E15 ion/cm². However, the energy power of the implantation process is from about 1 Kev to about 10 Kev. The gate dielectric layer 118 is treated to form the fluorine segment 122. Next, an annealing process is performed to further drive in the F atoms to form the fluorine region 124. An operation temperature of the anneal process is in a range of about 400° C. to about 600° C. In one embodiment, the fluorine region 124 is kept within the second III-V compound layer 106 and neither contacts the carrier channel 108 nor further extends into the first III-V compound layer 104. This configuration prevents F atoms from penetrating into the first III-V compound layer 104 and prevents negative effects by the operation of this enhanced-mode HEMT.

In yet another example, the structure 100 is treated in a plasma environment comprising $CF_4$. An operation power of the plasma environment is less than about 300 W. A bias power to guide the plasma radicals toward the structure 100 is less than about 300 W. The gate dielectric layer 118 is treated to form the fluorine segment 122. Next, an annealing process is performed to further drive in the F atoms to form the fluorine region 124.

Figure 8:
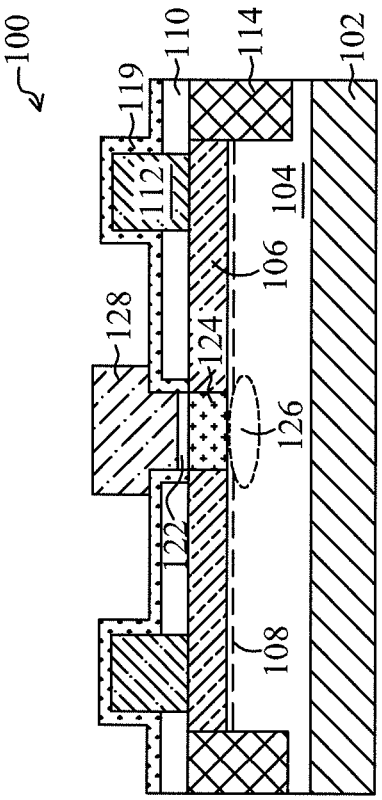

FIG. 8 illustrates the structure 100 after performing operation 206, which forms a gate electrode 128 on the fluorine segment 122 of the gate dielectric layer 119. The gate electrode 128 is also above the fluorine region 124 of the second III-V compound layer 106 overlying the depletion region 126. In one example, a gate electrode layer is deposited on the gate dielectric layer 119 and overfills the opening 116 shown in FIG. 7. Lithography and etching processes are performed on the gate electrode layer to define the gate electrode 128 between the source and drain features. In some embodiments, the gate electrode 128 includes a conductive material layer that includes a refractory metal or its compounds, e.g., titanium (Ti), titanium nitride (TiN), titanium tungsten (TiW) and tungsten (W). In another example, the gate electrode 128 includes nickel (Ni), gold (Au) or copper (Cu).

Various embodiments of the present disclosure may be used to improve the performance of a semiconductor structure having a high electron mobility transistor (HEMT). For example, in conventional methods, a portion of the second III-V compound layer 106 is etched to form a recess for an enhanced-mode HEMT. During etching the recess, the etching uniformity among the semiconductor chip regions on the same substrate 102 is hard to control. The electrical performances of each HEMT in the same semiconductor chip region or the same substrate 102 could not be accurately controlled. In this disclosure, the fluorine region 124 depletes the electrons in the carrier channel 108 for an enhanced-mode HEMT. The fluorine region 124 in the opening 116 eliminates the drawbacks in conventional methods. The fluorine-treated gate dielectric layer 119 also improves stability of the threshold voltage (Vt) of the HEMT in the structure 100. The metal feature 112 is free of Au and comprises Al, Ti or Cu. Without using Au in the metal feature 112, the method 200 can be implemented in the production line of integrated circuits on silicon substrate, because the contamination concern from Au on the silicon-Fab process is eliminated. Compared with the HEMT with Au in source/drain feature, the cost for manufacturing the HEMT according to the present application is reduced. Both the III-V semiconductor compounds process and the silicon-fabrication process can be implemented in the same production line. It increases the flexibility to allocate different products for the production line.

One aspect of this description relates to a method of forming a semiconductor structure. The method includes growing a second III-V compound layer over a first III-V compound layer, wherein the second III-V compound layer has a different band gap from the first III-V compound layer. The method further includes forming a source feature and a drain feature over the second III-V compound layer. The method further includes forming a gate dielectric layer over the second III-V compound layer, the source feature and the drain feature. The method further includes implanting at least one fluorine-containing compound into a portion of the gate dielectric layer. The method further includes forming a gate electrode over the portion of the gate dielectric layer.

Another aspect of this description relates to a method of forming a semiconductor structure. The method includes epitaxially growing a second III-V compound layer over a first III-V compound layer, wherein the second III-V compound layer has a different band gap from the first III-V compound layer. The method further includes depositing a metal layer to form a source feature and a drain feature in contact with the second III-V compound layer. The method further includes depositing a gate dielectric layer over the second III-V compound layer, the source feature and the drain feature, wherein the gate dielectric layer directly contacts a portion of the second III-V compound layer. The method further includes treating the gate dielectric layer in a plasma environment containing a fluorine-containing compound. The method further includes annealing the treated gate dielectric layer to drive fluorine atoms into the portion of the second III-V compound layer. The method further includes depositing a gate electrode over the gate dielectric layer.

Still another aspect of this description relates to a semiconductor structure. The semiconductor structure includes a first III-V compound layer. The semiconductor structure further includes a second III-V compound layer on the first III-V compound layer, wherein a carrier channel is located between the first III-V compound layer and the second III-V compound layer, and the second III-V compound layer comprises a fluorine-containing region. The semiconductor structure further includes a source feature and a drain feature on the second III-V compound layer. The semiconductor structure further includes a gate electrode over the fluorine-containing region. The semiconductor structure further includes a gate dielectric layer over the second III-V compound layer, the gate dielectric layer having a fluorine segment on the fluorine-containing region and under at least a portion of the gate electrode, wherein the gate dielectric layer extends over a top surface of the source feature and the drain feature.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method of forming a semiconductor structure, the method comprising:
    growing a second III-V compound layer over a first III-V compound layer, wherein the second III-V compound layer has a different band gap from the first III-V compound layer;
    forming a source feature and a drain feature over the second III-V compound layer;
    forming a gate dielectric layer over the second III-V compound layer, the source feature and the drain feature;
    implanting at least one fluorine-containing compound into a portion of the gate dielectric layer, wherein the fluorine-containing compound extends through an entirety of a thickness of the portion of the gate dielectric layer; and
    forming a gate electrode over the portion of the gate dielectric layer.

2. The method of claim 1, wherein implanting the at least one fluorine-containing compound further comprises implanting the at least one fluorine-containing compound into the second III-V compound layer.

3. The method of claim 1, further comprising depositing a cap layer over the second III-V compound layer, wherein the cap layer is between the second III-V compound layer and a region of the gate dielectric layer.

4. The method of claim 3, further comprising etching the cap layer to form an opening in the cap layer, wherein the portion of the gate dielectric layer is in the opening in the cap layer.

5. The method of claim 3, further comprising etching the cap layer to form a first opening and a second opening in the cap layer, wherein forming the source feature comprises forming the source feature in the first opening, and forming the drain feature comprises forming the drain feature in the second opening.

6. The method of claim 5, further comprising etching the cap layer to form a third opening in the cap layer exposing the second III-V compound layer, wherein the portion of the gate dielectric layer is in the third opening.

7. The method of claim 3, further comprising depositing a protection layer over the cap layer, wherein the protection layer is between the cap layer and the region of the gate dielectric layer.

8. The method of claim 7, wherein depositing the protection layer comprises depositing the protection layer over the source feature and the drain feature.

9. The method of claim 1, further comprising annealing the semiconductor structure after implanting the at least one fluorine-containing compound into the gate dielectric layer.

10. A method of forming a semiconductor structure, the method comprising:
    epitaxially growing a second III-V compound layer over a first III-V compound layer, wherein the second III-V compound layer has a different band gap from the first III-V compound layer;
    depositing a metal layer to form a source feature and a drain feature in contact with the second III-V compound layer;
    depositing a gate dielectric layer over the second III-V compound layer, the source feature and the drain feature, wherein the gate dielectric layer directly contacts a portion of the second III-V compound layer;
    treating the gate dielectric layer in a plasma environment containing a fluorine-containing compound;
    annealing the treated gate dielectric layer to drive fluorine atoms into the portion of the second III-V compound layer; and
    depositing a gate electrode over the gate dielectric layer after annealing the treated gate dielectric.

11. The method of claim 10, wherein treating the gate dielectric layer comprises treating the gate dielectric layer at an operation power less than about 300 Watts.

12. The method of claim 10, wherein depositing the metal layer comprises depositing the metal layer free of gold (Au).

13. The method of claim 12, wherein depositing the gate electrode comprises depositing the gate electrode comprising gold (Au).

14. The method of claim 10, wherein depositing the gate dielectric layer comprises depositing the gate dielectric layer using a first precursor comprising tetrakis[ethylmethylamino]zirconium (TEMAZr) or zirconium chloride ($ZrCl_4$).

15. The method of claim 14, wherein depositing the gate dielectric layer comprises depositing the gate dielectric layer using a second precursor comprising ozone ($O_3$), oxygen, water ($H_2O$), $N_2O$ or $H_2O$—$H_2O_2$.

16. The method of claim 15, wherein depositing the gate dielectric layer comprises depositing the gate dielectric layer contacting a deposition surface with the first precursor and the second precursor.

17. A method of forming a semiconductor structure, the method comprising:
   forming a source feature and a drain feature over a channel region of a transistor;
   forming a gate dielectric layer over the channel region, the source feature and the drain feature;
   implanting a fluorine-containing compound into the gate dielectric layer; and
   forming a gate electrode over a portion of the gate dielectric layer, wherein a region of the gate dielectric layer implanted with the fluorine-containing compound is exposed by the gate electrode.

18. The method of claim 17, wherein implanting the fluorine-containing compound comprises forming a depletion region in the channel region.

19. The method of claim 17, wherein implanting the fluorine-containing compound comprises implanting the fluorine-containing compound into a portion of the gate dielectric layer over source feature and the drain feature.

20. The method of claim 17, wherein forming the gate dielectric layer comprises:
   forming a first portion of the gate dielectric layer in direct contact with a III-V compound layer of the transistor; and
   forming a second portion of the gate dielectric layer separated from the III-V compound layer.

* * * * *